(12) United States Patent
Lee et al.

(10) Patent No.: US 9,390,852 B2
(45) Date of Patent: Jul. 12, 2016

(54) MULTILAYER CERAMIC ELECTRONIC PART TO BE EMBEDDED IN BOARD AND PRINTED CIRCUIT BOARD HAVING MULTILAYER CERAMIC ELECTRONIC PART EMBEDDED THEREIN

(71) Applicant: SAMSUNG ELECTRO-MECHANICS CO., LTD., Suwon, Gyunggi-do (KR)

(72) Inventors: Byoung Hwa Lee, Gyunggi-do (KR); Doo Young Kim, Gyunggi-do (KR); Hai Joon Lee, Gyunggi-do (KR); Jin Man Jung, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 165 days.

(21) Appl. No.: 14/174,591

(22) Filed: Feb. 6, 2014

(65) Prior Publication Data

US 2015/0041198 A1 Feb. 12, 2015

(30) Foreign Application Priority Data

Aug. 9, 2013 (KR) ........................ 10-2013-0094689

(51) Int. Cl.
*H01G 2/06* (2006.01)
*H01G 4/30* (2006.01)
*H01G 4/005* (2006.01)
(Continued)

(52) U.S. Cl.
CPC .................. *H01G 2/06* (2013.01); *H01G 4/005* (2013.01); *H01G 4/232* (2013.01); *H01G 4/30* (2013.01); *H05K 1/185* (2013.01);
(Continued)

(58) Field of Classification Search
CPC ........... H01G 2/06; H01G 4/232; H01G 4/30; H05K 2201/10015
See application file for complete search history.

(56) References Cited

U.S. PATENT DOCUMENTS 6,407,907 B1 6/2002 Ahiko et al.
6,606,237 B1 8/2003 Naito et al.
(Continued)

FOREIGN PATENT DOCUMENTS

JP 06-349668 A 12/1994
JP 2000-183677 A 6/2000
(Continued)

OTHER PUBLICATIONS

Japanese Office Action dated Aug. 4, 2015 issued in Japanese Patent Application No. 2013-259252 (English translation).
(Continued)

*Primary Examiner* — David M Sinclair
(74) *Attorney, Agent, or Firm* — McDermott Will & Emery LLP

(57) ABSTRACT

There is provided a multilayer ceramic electronic part to be embedded in a board, the multilayer ceramic electronic part including: a ceramic body including dielectric layers; first and second internal electrodes disposed in the ceramic body; first and second external electrodes formed on the respective end portions of the ceramic body, and a third external electrode formed on first and second main surfaces of the ceramic body, wherein an outermost first internal electrode among the first internal electrodes is connected to the first and second external electrodes through at least one first via, and the second internal electrodes are connected to the third external electrode through at least one second via.

11 Claims, 9 Drawing Sheets

(51) Int. Cl.
*H01G 4/232* (2006.01)
*H05K 1/18* (2006.01)

(52) U.S. Cl.
CPC ............... *H05K 2201/10015* (2013.01); *H05K 2201/10636* (2013.01); *Y02P 70/611* (2015.11)

(56) References Cited

U.S. PATENT DOCUMENTS

| | | | |
|---|---|---|---|
| 2002/0101702 A1* | 8/2002 | Makl, Jr. | H01G 4/30 361/306.3 |
| 2005/0248908 A1 | 11/2005 | Dreezen et al. | |
| 2007/0041146 A1* | 2/2007 | Togashi | H01G 4/012 361/305 |
| 2007/0165361 A1* | 7/2007 | Randall | H01G 4/30 361/306.3 |
| 2008/0019076 A1 | 1/2008 | Togashi | |
| 2009/0002921 A1* | 1/2009 | Ritter | H01C 1/148 361/321.3 |
| 2010/0149769 A1* | 6/2010 | Lee | H01G 2/065 361/768 |
| 2012/0018205 A1 | 1/2012 | Sato et al. | |
| 2012/0019099 A1 | 1/2012 | Sato et al. | |
| 2012/0127627 A1 | 5/2012 | Brendel et al. | |
| 2012/0188682 A1 | 7/2012 | Sato et al. | |
| 2012/0320495 A1* | 12/2012 | Akazawa | H01G 4/30 361/321.2 |

FOREIGN PATENT DOCUMENTS

| | | |
|---|---|---|
| JP | 2000-252131 A | 9/2000 |
| JP | 2001-189234 A | 7/2001 |
| JP | 2002-343677 A | 11/2002 |
| JP | 2003-347160 A | 12/2003 |
| JP | 2008-28195 A | 2/2008 |
| JP | 2008-118078 A | 5/2008 |
| JP | 2009-194397 A | 8/2009 |
| JP | 2010-097994 A | 4/2010 |
| JP | 2012-28456 A | 2/2012 |
| JP | 2012-028458 A | 2/2012 |
| JP | 2012-164966 A | 8/2012 |
| JP | 2012-186251 A | 9/2012 |
| KR | 10-2005-0071980 A | 7/2005 |
| KR | 10-2006-0047733 A | 5/2006 |
| WO | 2008/143075 A1 | 11/2008 |

OTHER PUBLICATIONS

Office Action issued on Jul. 21, 2014 in the corresponding Korean patent application No. 10-2013-0094689.

* cited by examiner

MULTILAYER CERAMIC ELECTRONIC PART TO BE EMBEDDED IN BOARD AND PRINTED CIRCUIT BOARD HAVING MULTILAYER CERAMIC ELECTRONIC PART EMBEDDED THEREIN

CROSS-REFERENCE TO RELATED APPLICATION

This application claims the benefit of Korean Patent Application No. 10-2013-0094689 filed on Aug. 9, 2013, with the Korean Intellectual Property Office, the disclosure of which is incorporated herein by reference.

BACKGROUND

The present disclosure relates to a multilayer ceramic electronic part to be embedded and a printed circuit board having the multilayer ceramic electronic part embedded therein.

As an electronic circuit has undergone high densification and high integration, mounting space on the printed circuit board for mounting passive elements has become insufficient. To overcome this problem, an embedded device, a part embedded in a board, has been under development. In particular, various methods to embed a multilayer ceramic electronic part, which is used as a capacitive component, in a board have been proposed.

As an example of a method of embedding a multilayer ceramic electronic part in the board, the material of a board itself may be used as the dielectric material for a multilayer ceramic electronic part and copper wire or the like may be used as an electrode for the multilayer ceramic electronic part. Alternatively, a polymer sheet having a high permittivity or a thin film dielectric may be formed in a board to form a multilayer ceramic electronic part to be embedded, or a multilayer ceramic electronic part may be embedded in a board.

Typically, a multilayer ceramic electronic part includes a plurality of dielectric layers formed of a ceramic material, and internal electrodes each interposed between the dielectric layers. By disposing such a multilayer ceramic electronic part in a board, a multilayer ceramic electronic part to be embedded having high capacitance can be implemented.

In order to manufacture a printed circuit board having a multilayer ceramic electronic part embedded therein, after a multilayer ceramic electronic part is inserted in a core board, via holes are to be made in a top layer plate and a bottom layer plate using laser in order to connect board wirings to external electrodes of the multilayer ceramic electronic part. The laser processing contributes to a significant increase in manufacturing costs of the printed circuit board.

Further, since a multilayer ceramic electronic part is embedded in a core part in a board, a nickel/tin (Ni/Sn) plating layer is not necessary on external electrodes, unlike a typical multilayer ceramic electronic part which is mounted on a surface of a board.

Since an external electrode of a multilayer ceramic electronic part to be embedded is electrically connected to a circuit in the board through a via formed of copper (Cu) material, a copper (Cu) layer is necessary on the external electrode instead of the nickel/tin (Ni/Sn) layer.

In general, although the external electrode contains copper (Cu) as a main component, it also contains glass which absorbs laser during laser processing used to form a via in the board. Therefore, the processing depth of the via cannot be adjusted.

For this reason, a separate copper (Cu) plating layer is formed on the external electrode of the multilayer ceramic electronic part to be embedded.

The multilayer ceramic electronic part is embedded in a printed circuit board used in memory cards, PC main boards, and various radio frequency (RF) modules, such that the size of a product may be significantly reduced compared to when a multilayer ceramic electronic part is mounted on a board.

Further, the multilayer ceramic electronic part to be embedded may be disposed significantly close to an input terminal of an active element such as a microprocessor unit (MPU), such that interconnect inductance associated with the length of conduction lines may be reduced.

Such reduction in inductance obtained in the multilayer ceramic electronic part to be embedded is merely caused by a decrease in the interconnect inductance achieved by the inherent arrangement in which the parts are embedded in the board. Accordingly, equivalent series inductance (ESL) characteristics of the multilayer ceramic electronic part to be embedded still need improvement.

In general, in the multilayer ceramic electronic part to be embedded, a current path in the multilayer ceramic electronic part needs to be shortened in order to lower the ESL characteristics.

However, it is not easy to shorten the current path, because a plating solution may permeate the external electrode if a separate copper (Cu) plating layer is formed on the external electrode of the multilayer ceramic electronic part to be embedded.

RELATED ART DOCUMENT (Patent Document 1) Korean Patent Laid-Open Publication No. 2006-0047733

SUMMARY

An aspect of the present disclosure may provide a multilayer ceramic electronic part to be embedded and a printed circuit board having the multilayer ceramic electronic part embedded therein.

According to an aspect of the present disclosure, a multilayer ceramic electronic part to be embedded may include: a ceramic body including dielectric layers and having first and second main surfaces opposing each other, first and second side surfaces opposing each other, and first and second end surfaces opposing each other; first and second internal electrodes disposed in the ceramic body, each of the first internal electrodes having a first lead portion exposed to the first and second side surfaces and the first end surface of the ceramic body and a second lead portion exposed to the first and second side surfaces and the second end surface of the ceramic body, the second internal electrodes being spaced apart from the first and second side surfaces and the first and second end surfaces of the ceramic body by a predetermined distance; and first and second external electrodes formed on the respective end portions of the ceramic body and connected to the first internal electrodes and a third external electrode formed on the first and second main surfaces of the ceramic body and connected to the second internal electrodes, wherein the first to third external electrodes include first to third base electrodes and first to third terminal electrodes formed on the first to third base electrodes, respectively, an outermost first internal electrode among the first internal electrodes is connected to the first and second base electrodes through at least one first via extended to at least one of the first and second main surfaces of the ceramic body, and the second internal electrodes are connected to the third base electrode through at least one second via extended to at least one of the first and second main surfaces of the ceramic body.

The first internal electrode may have a through hole formed therein so as to be insulated from the second via.

The first and second vias may be extended to the first main surface.

The first via may include two or more vias connected to the first base electrode, and two or more vias connected to the second base electrode.

The first via may pass through the first internal electrodes so as to be connected to all of the first internal electrodes.

The first and the second terminal electrodes may be formed of copper (Cu).

The first and second terminal electrodes may have a thickness of 5 μm or greater.

When a surface roughness of the first and second terminal electrodes is Ra and a thickness of the first and second terminal electrodes is tp, 200 nm≤Ra≤tp may be satisfied The first and second terminal electrodes may be formed by a plating process.

The ceramic body may have a thickness of 250 μm or less.

According to another aspect of the present disclosure, a multilayer ceramic electronic part to be embedded in a board may include: a ceramic body including dielectric layers and having first and second main surfaces opposing each other, first and second side surfaces opposing each other, and first and second end surfaces opposing each other; first and second internal electrodes formed in the ceramic body, each of the first internal electrodes having a first lead portion exposed to the first and second side surfaces and the first end surface of the ceramic body and a second lead portion exposed to the first and second side surfaces and the second end surface of the ceramic body, and each of the second internal electrodes being spaced apart from the first and second end surfaces of the ceramic body by a predetermined distance and having third and fourth lead portions exposed to the first and second side surfaces, respectively; first and second external electrodes formed on respective end portions of the ceramic body and connected to the first internal electrodes, and a third external electrode spaced apart from the first and second external electrodes while enclosing the ceramic body and connected to the second internal electrode, wherein the first to third external electrodes include first to third base electrodes and first to third terminal electrodes formed on the first to third base electrodes, respectively, an outermost first internal electrode among the first internal electrodes is connected to the first and second base electrodes through at least one first via extended to at least one of the first and second main surfaces of the ceramic body, and an outermost second internal electrode among the second internal electrodes is connected to the third base electrode through at least one second via extended to at least one of the first and second main surfaces of the ceramic body.

The outermost first internal electrode among the first internal electrodes may have a through hole formed therein so as to be insulated from the second via.

The first and second vias may be extended to the first main surface.

The first and the second terminal electrodes may be formed of copper (Cu).

The first and second terminal electrodes may have a thickness of 5 μm or greater.

When a surface roughness of the first and second terminal electrodes is Ra and a thickness of the first and second terminal electrodes is tp, 200 nm≤Ra≤tp may be satisfied The first and second terminal electrodes may be formed by a plating process.

The ceramic body h as a thickness of 250 μm or less.

According to another aspect of the present disclosure, a printed circuit board having a multilayer ceramic electronic part embedded therein may include: an insulating substrate; and the multilayer ceramic electronic part described above, embedded in the insulating substrate.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Figure 1:
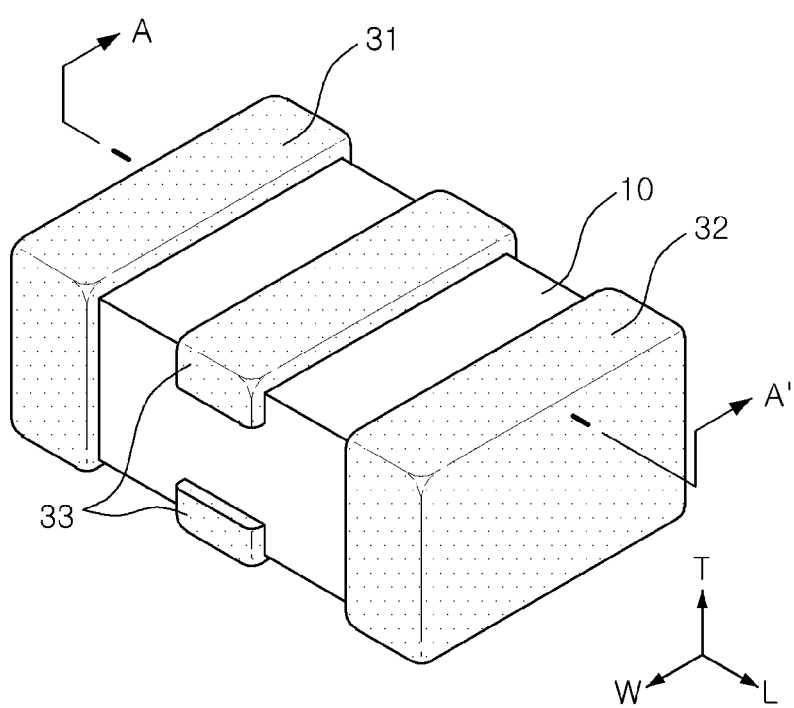
FIG. 1 is a perspective view of a multilayer ceramic electronic part to be embedded in a board according to an exemplary embodiment of the present disclosure.

In the drawings, the shapes and dimensions of elements may be exaggerated for clarity, and the same reference numerals will be used throughout to designate the same or like elements Multilayer Ceramic Electronic Part to be Embedded in Board FIG. 1 is a perspective view of a multilayer ceramic electronic part to be embedded in a board according to an exemplary embodiment of the present disclosure.

Figure 2:
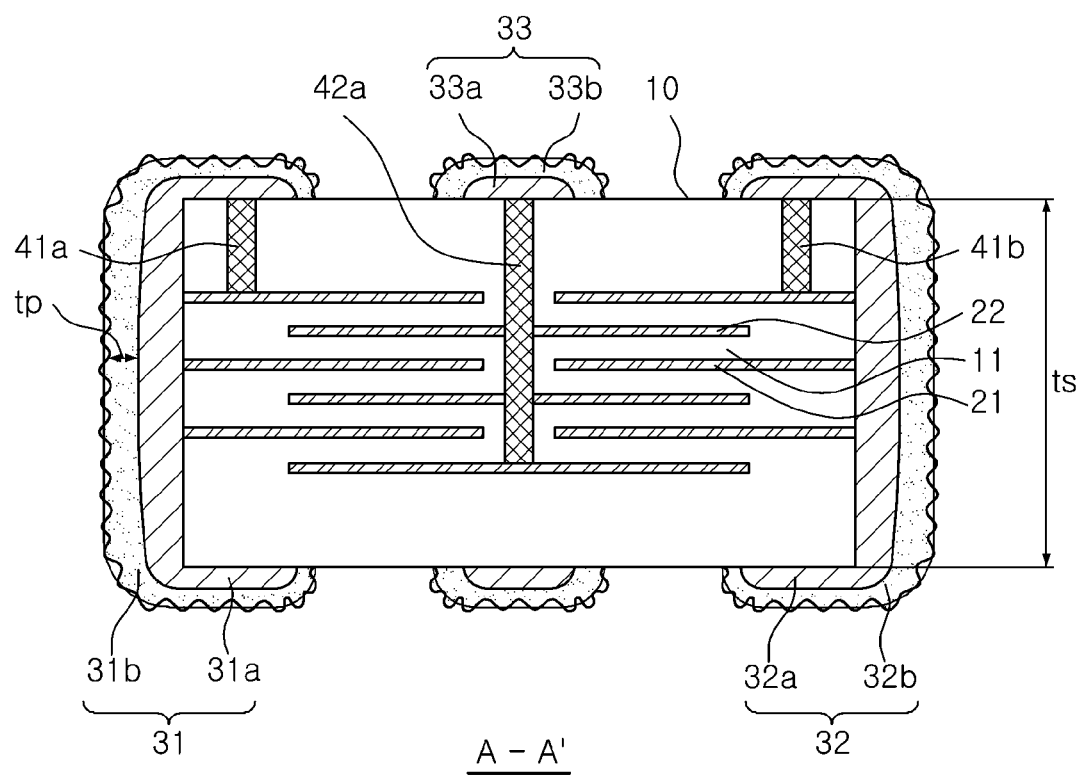
FIG. 2 is a cross-sectional view, taken along line A-A' of FIG. 1, of the multilayer ceramic electronic part according to the exemplary embodiment of the present disclosure.

FIG. 2 is a cross-sectional view taken along line A-A' of FIG. 1 of the multilayer ceramic electronic part according to the exemplary embodiment.

Figure 3:
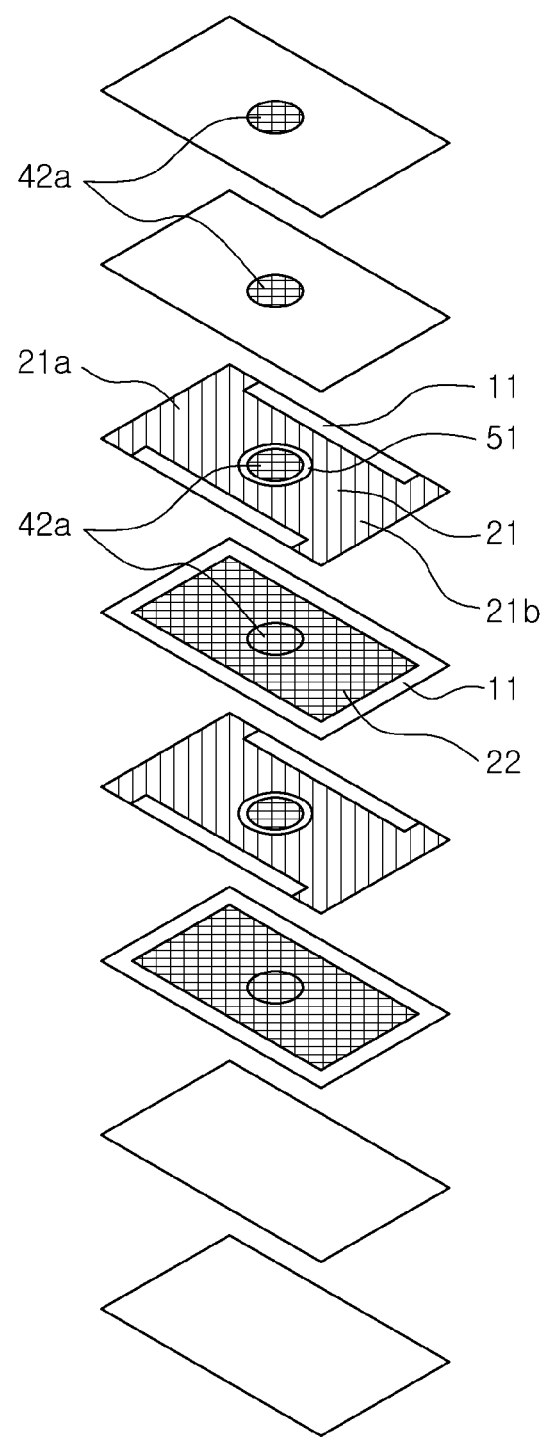
FIG. 3 is an exploded perspective view of the multilayer ceramic electronic part of FIG. 1.

FIG. 3 is an exploded perspective view of the multilayer ceramic electronic part of FIG. 1.

Referring to FIGS. 1 through 3, a multilayer ceramic electronic part to be embedded in a board according to an exemplary embodiment of the present disclosure may include: a ceramic body 10 including dielectric layers 11 and having first and second main surfaces opposing each other, first and second side surfaces opposing each other, and first and second end surfaces opposing each other; first and second internal electrodes 21 and 22 formed in the ceramic body 10, wherein each of the first internal electrodes 21 has a first lead portion 21a exposed to the first and second side surfaces and the first end surface of the ceramic body and a second lead portion 21b exposed to the first and second side surfaces and the second end surface of the ceramic body 10, and the second internal electrodes 22 are spaced apart from the first and second side surfaces and the first and second end surfaces of the ceramic body 10 by a predetermined distance; first and second external electrodes 31 and 32 each formed on the respective end portion of the ceramic body 10 and connected to the first internal electrodes 21; and third external electrodes 33 formed along the upper and lower surfaces of the ceramic body 10 and connected to the second internal electrode 22, wherein the first to third external electrodes 31, 32 and 33 include first to third base electrodes 31a, 32a and 33a and first to third terminal electrodes 31b, 32b and 33b formed on the first to third base electrodes 31a, 32a and 33a, respectively, an outermost first internal electrode among the first internal electrodes 21 is connected to the first and second base electrodes 31a and 32a through at least one first via 41a and 41b extended to at least one of the first and second main surfaces of the ceramic body 10, and the second internal electrodes 22 are connected to the third base electrode 33a through at least one second via 42a extended to at least one of the first and second main surfaces of the ceramic body 10.

Hereinafter, the multilayer ceramic electronic part according to the exemplary embodiment of the present disclosure will be described. In particular, a multilayer ceramic capacitor will be described, but the present disclosure is not limited thereto.

In the multilayer ceramic capacitor according to the exemplary embodiment of the present disclosure, a "length direction" refers to an "L" direction of FIG. 1, a "width direction" refers to a "W" direction of FIG. 1, and a "thickness direction" refers to a "T" direction of FIG. 1. Here, the "thickness direction" may be the same as a direction in which the dielectric layers are stacked, that is, a "stacked direction".

In the exemplary embodiment of the present disclosure, the shape of the ceramic body 10 may be, but is not limited to, a hexahedral shape as shown.

In the exemplary embodiment of the present disclosure, the ceramic body 10 may have first and second main surfaces opposing each other, the first and second side surfaces opposing each other, and the first and second end surfaces opposing each other. The first and second main surfaces may be referred to as a top surface and a bottom surface of the ceramic body 10, respectively.

The ceramic body 10 may have a thickness ts of 250 μm or less.

By manufacturing the ceramic body 10 to have a thickness ts of 250 μm or less, it may be suitable for the multilayer ceramic capacitor to be embedded in a board.

Further, the thickness ts of the ceramic body 10 may be a distance from the first main surface to the second main surface.

According to the exemplary embodiment of the present disclosure, a material forming the dielectric layer 11 is not particularly limited as long as sufficient capacitance may be obtained. For example, the material may be barium titanate ($BaTiO_3$) powder.

The material of the dielectric layer 11 may be formed by adding various ceramic additives, organic solvents, plasticizers, binders, dispersing agents, and the like, to powder such as barium titanate ($BaTiO_3$) powder, as required by purposes of the present disclosure.

An average particle diameter of ceramic powder used as the material of the dielectric layer 11 may be adjusted as required by the purposes of the present disclosure. For example, the average particle diameter may be adjusted to, but is not limited to, 400 nm or less.

The ceramic body 10 may include an active layer contributing to forming capacitance in the capacitor, and upper and lower cover layers formed on and below the active layer, respectively, as upper and lower margin portions.

The active layer may be formed by alternately stacking a plurality of first and second internal electrodes 21 and 22, having the dielectric layer 11 interposed therebetween.

The upper and lower cover layers may be formed of the same material and configuration as those of the dielectric layer 11, except for not including the internal electrodes.

The upper and lower cover layers may be formed by stacking a single dielectric layer or two or more dielectric layers on upper and lower surfaces of the active layer in upper and lower directions, respectively, and may prevent damage to the internal electrodes caused by physical or chemical stress.

The first and second internal electrodes 21 and 22, provided as pairs of electrodes having opposite polarities, may be formed by printing a conductive paste including a conductive metal on the dielectric layer 11 at a predetermined thickness.

The first and second internal electrodes 21 and 22 may be formed in the stacked direction of the dielectric layer 11 and be electrically insulated from each other by the dielectric layer 11 interposed therebetween.

The first internal electrode 21 may include a first lead portion 21a exposed to the first and second side surfaces and the first end surface of the ceramic body 10, and a second lead portion 21b exposed to the first and second side surfaces and the second end surface of the ceramic body 10.

As described below, the first internal electrode 21 may be electrically connected to the first and second external electrodes 31 and 32 through the first and second lead portions, respectively.

The second internal electrode 22 may be spaced apart from the first and second side surfaces and the first and second end surfaces of the ceramic body 10 by a predetermined distance, and may be electrically connected to the third external electrode 33 through a second via 42a as described below.

Accordingly, when a voltage is applied to the first to third external electrodes 31, 32 and 33, charges are accumulated between the first and second internal electrodes 21 and 22 opposing each other, and the capacitance of the multilayer ceramic capacitor is proportional to an area of a region in which the first and second internal electrodes 21 and 22 overlap.

The conductive metal included in the conductive paste forming the first and second internal electrodes 21 and 22 may be, but is not limited to, nickel (Ni), copper (Cu), palladium (Pd) or an alloy thereof.

A method of printing the conductive paste may include, but is not limited to, screen printing or gravure printing.

According to the exemplary embodiment of the present disclosure, the first and second external electrodes 31 and 32 connected to the first internal electrodes 21 may be formed on both end portions of the ceramic body 10, and the third external electrodes 33 connected to the second internal electrodes 22 may be formed on the upper and lower surfaces of the ceramic body 10.

Accordingly, the embedded multilayer ceramic capacitor according to the exemplary embodiment of the present disclosure may have three terminals, but is not limited to.

The first external electrode 31 may include a first base electrode 31a electrically connected to the first internal electrodes 21 and a first terminal electrode 31b formed on the first base electrode 31a.

The second external electrode 32 may include a second base electrode 32a electrically connected to the first internal electrodes 21 and a second terminal electrode 32b formed on the second base electrode 32a.

The third external electrode 33 may include a third base electrode 33a electrically connected to the second internal electrodes 22 and a third terminal electrode 33b formed on the third base electrode 33a.

Hereinafter, structures of the first to third external electrodes 31, 32 and 33 will be described in detail.

The first to third base electrodes 31a, 32a and 33a may include a first conductive metal and glass.

The first to third external electrodes 31, 32 and 33 may be formed on both end portions and upper and lower surfaces of the ceramic body 10 in order to form capacitance, and the first to third base electrodes 31a, 32a and 33a included in the first to third external electrodes 31, 32, and 33 may be electrically connected to the first and second internal electrodes 21 and 22.

The first to third base electrodes 31a, 32a and 33a may be formed of the same conductive material as that of the first and second internal electrodes 21 and 22. However, the material of the base electrodes is not limited thereto, and may be formed of at least one first conductive material selected from a group consisting of copper (Cu), silver (Ag), Nickel (Ni) and an alloy thereof.

The first to third base electrodes 31a, 32a and 33a may be formed by applying a conductive paste prepared by adding glass frit to the first conductive metal powder and then firing it.

According to the exemplary embodiment of the present disclosure, the first to third external electrodes 31, 32 and 33 may include the first to third terminal electrodes 31b, 32b and 33b formed on the first to third base electrodes 31a, 32a and 33a.

The first to third terminal electrodes 31b, 32b and 33b may be formed of a second conductive metal.

The second conductive metal may be, but is not limited to, copper (Cu).

Traditionally, since a multilayer ceramic capacitor is mounted on a printed circuit board, nickel/tin plating layers are formed on external electrodes.

The multilayer ceramic capacitor according to the exemplary embodiment of the present disclosure is not mounted on a circuit board but embedded in a printed circuit board, and the first to third external electrodes 31, 32 and 33 of the multilayer ceramic capacitor are electrically connected to circuits on the board through vias formed of copper (Cu).

Therefore, according to the exemplary embodiment of the present disclosure, the first to third terminal electrodes 31b, 32b and 33b may be formed of copper (Cu) having high electrical connectivity with copper (Cu), the material of the vias.

Although the first to third base electrodes 31a, 32a and 33a contain copper (Cu) as a main component, they also contain glass which absorbs laser during laser processing used to form the vias in the board. Therefore, the processing depth of the vias cannot be adjusted.

For this reason, the first to third terminal electrodes 31b, 32b and 33b of the embedded multilayer ceramic electronic part may be formed of copper (Cu).

A method of forming the first to third terminal electrodes 31b, 32b and 33b is not specifically limited, and may include, for example, plating.

Accordingly, since the first to third terminal electrodes 31b, 32b and 33b are formed only of copper (Cu) and do not contain glass frit after sintering, the problem that glass absorbs laser during laser processing used to form the vias in the board such that the processing depth of vias cannot be adjusted can be avoided.

According to the exemplary embodiment of the present disclosure, outermost first internal electrodes among the first internal electrodes 21 may be connected to the first and second base electrodes 31a and 32a through one or more first vias 41a and 41b extending from at least one of the first and second main surfaces of the ceramic body 10, and the second internal electrodes 22 may be connected to the third base electrode 33a through one or more second vias 42a extending from at least one of the first and second main surfaces of the ceramic body 10.

Typically, copper (Cu) plating layers are separately formed on external electrodes of a multilayer ceramic electronic part to be embedded in a board, such that internal electrodes may be damaged due to permeation of a plating solution.

Therefore, thicker upper and lower cover layers are formed in the embedded multilayer ceramic electronic part to prevent damage to the internal electrodes due to permeation of the plating solution.

However, if the upper and lower cover layers are formed thicker, a current path in the embedded multilayer ceramic electronic part becomes longer such that it is difficult to reduce equivalent series inductance (ESL).

However, according to the exemplary embodiment of the present disclosure, the outermost first internal electrodes among the first internal electrodes 21 are connected to the first and second base electrodes 31a and 32a through one or more first vias 41a and 41b extending from at least one of the first and second main surfaces of the ceramic body 10, and the second internal electrodes 22 are connected to the third base electrode 33a through one or more second vias 42a extending from at least one of the first and second main surfaces of the ceramic body 10, such that the equivalent series inductance (ESL) may be reduced.

Specifically, by shortening the current path in the multilayer ceramic electronic part to be embedded in a board, the equivalent series inductance (ESL) may be reduced.

In a typical multilayer ceramic electronic part to be embedded in a board, current paths are formed such that a current flows through the first end surface to first internal electrodes of a ceramic body by the voltage applied to the first external electrode, and a current flows through the second end surface to second internal electrodes and to the second external electrode of the ceramic body.

However, in the case in which the outermost first internal electrodes among the first internal electrodes 21 are connected to the first and second base electrodes 31a and 32a through one or more first vias 41a and 41b extending from at least one of the first and second main surfaces of the ceramic body 10, and the second internal electrodes 22 are connected to the third base electrode 33a through one or more second vias 42a extending from at least one of the first and second main surfaces of the ceramic body 10 according to the exemplary embodiment of the present disclosure, the current path may be shortened.

That is, in the case in which the current flows through the first or second main surface of the ceramic body according to the exemplary embodiment of the present disclosure, in contrast to the case in which the current flows through the end surfaces of the ceramic body, the current path may be shortened.

By shortening the current path as described above, the equivalent series inductance (ESL) in the embedded multilayer ceramic electronic part may be reduced.

A method of forming the second via 42a will be described in detail with reference to FIG. 3.

Referring to FIG. 3, the second internal electrodes 22 are spaced apart from the first and second side surfaces and the first and second end surfaces of the ceramic body by a predetermined distance, such that they are not connected to the external electrodes.

By forming a through hole 51 in the first internal electrodes 21 to form a second via 42a on all of the second internal electrodes 22 through the first internal electrodes 21, the second via 42a may be exposed to at least one of the first or second main surface.

The through hole 51 may insulate the first internal electrodes 21 from the second via 42a.

The second via 42a may be electrically connected to the third base electrode 33a of the third external electrode 33, such that the second internal electrodes 22 may be connected to the third external electrode 33.

Although the second vias 42a is formed only on the upper cover layer so that it is exposed to the first main surface in FIG. 3, exemplary embodiments of the present disclosure are not limited thereto.

Where tp refers to the thickness of the first to third terminal electrodes 31b, 32b and 33b, tp 5 μm may be satisfied.

Although the thickness tp of the first to third terminal electrodes 31b, 32b and 33b may satisfy tp 5 μm, the present disclosure is not limited thereto and may be 15 μm or less.

By adjusting the thickness tp of the first to third terminal electrodes 31b, 32b and 33b to be 5 μm or greater and 15 μm or smaller, the multilayer ceramic capacitor having excellent via processing in the board and having excellent reliability may be achieved.

If the thickness tp of the first to third terminal electrodes 31b, 32b and 33b is smaller than 5 μm, as described below, a defect in which the conductive via hole reaches the ceramic body 10 may occur at the time of processing the conductive via hole when a multilayer ceramic electronic part is embedded in a printed circuit board.

If the thickness tp of the first to third terminal electrodes 31b, 32b and 33b is greater than 15 μm, cracks may occur in the ceramic body 10 due to stress of the first to third terminal electrodes 31b, 32b and 33b.

Referring back to FIG. 2, the multilayer ceramic electronic part according to the exemplary embodiment of the present disclosure may satisfy 200 nm≤Ra≤tp, where Ra refers a surface roughness of the first to third terminal electrodes 31b, 32b and 33b and tp refers to the thickness of the first to third terminal electrodes 31b, 32b and 33b.

By adjusting the surface roughness Ra of the first to third terminal electrodes 31b, 32b and 33b to satisfy 200 nm≤Ra≤tp, delamination between the multilayer ceramic electronic part and the board may be suppressed and cracks may be prevented.

The surface roughness refers to fine irregularities on a surface occurring during the processing of a metal surface.

The surface roughness is caused by tools and methods used during the processing, scratches, and rusts on the surface. The surface roughness may be calculated by obtaining a distance between a peak and a valley of a curve on a cross section perpendicular to the surface, and taking it as a centerline average roughness, which is denoted by Ra.

Hereinafter, Ra refers to the centerline average roughness of the first to third terminal electrodes 31b, 32b and 33b.

A method of calculating the centerline average roughness Ra of the first to third terminal electrodes 31b, 32b and 33b will be described in detail. Initially, a virtual centerline may be drawn with respect to a roughness formed on a surface of the first to third terminal electrodes 31b, 32b and 33b.

Then, distances (for example, $r_1, r_2, r_3 \ldots r_{13}$) may be measured from the virtual centerline of the roughness. An average of the distances may be calculated using the following equation and the centerline average roughness Ra of the first to third terminal electrodes 31b, 32b and 33b may be calculated using the average.

$$R_a = \frac{|r_1| + |r_2| + |r_3| + \cdots |r_n|}{n}$$

By adjusting the centerline average roughness Ra of the first to third terminal electrodes 31b, 32b and 33b to satisfy 200 nm≤Ra≤tp, a reliable multilayer ceramic electronic part having good withstand characteristics and improved adhesiveness with the board may be achieved.

If the surface roughness Ra of the first to third terminal electrodes 31b, 32b and 33b is less than 200 nm, delamination between the multilayer ceramic electronic part and the board may occur.

On the other hand, if the surface roughness Ra of the first to third terminal electrodes 31b, 32b and 33b is greater than the thickness tp of the first to third terminal electrodes 31b, 32b and 33b, cracks may occur.

Figure 4:
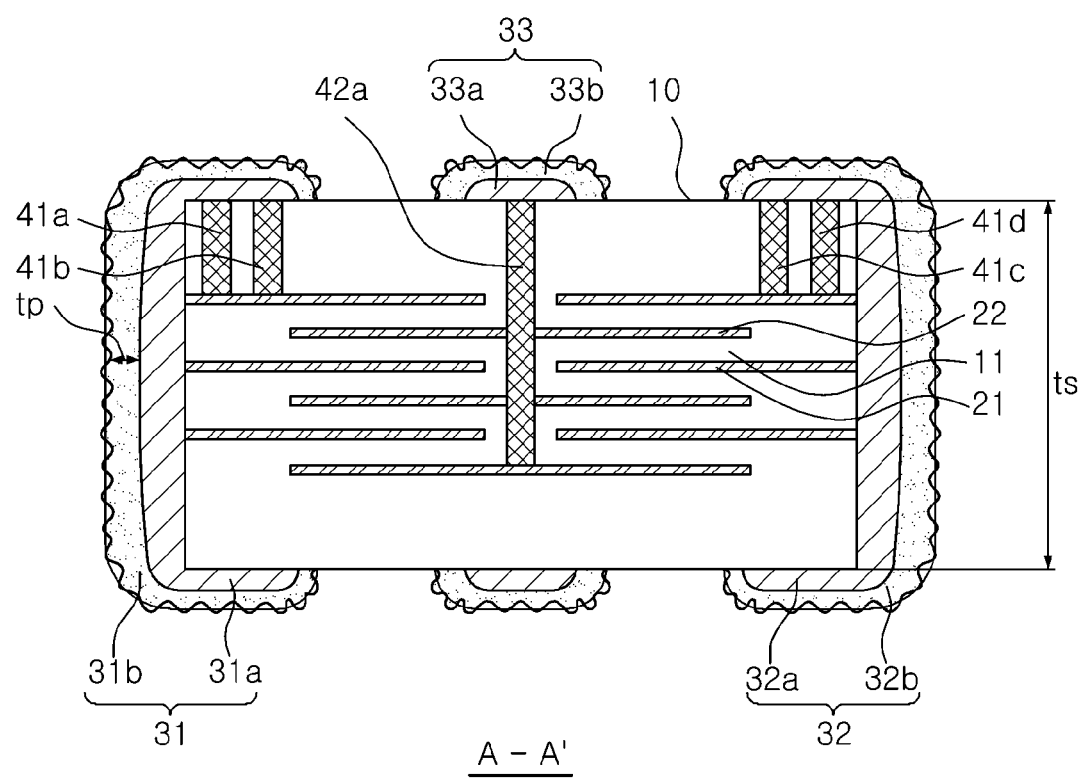
FIGS. 4 and 5 are cross-sectional views, taken along line A-A' of FIG. 1, of the multilayer ceramic electronic part to be embedded in a board according to various exemplary embodiments of the present disclosure.
Figure 5:
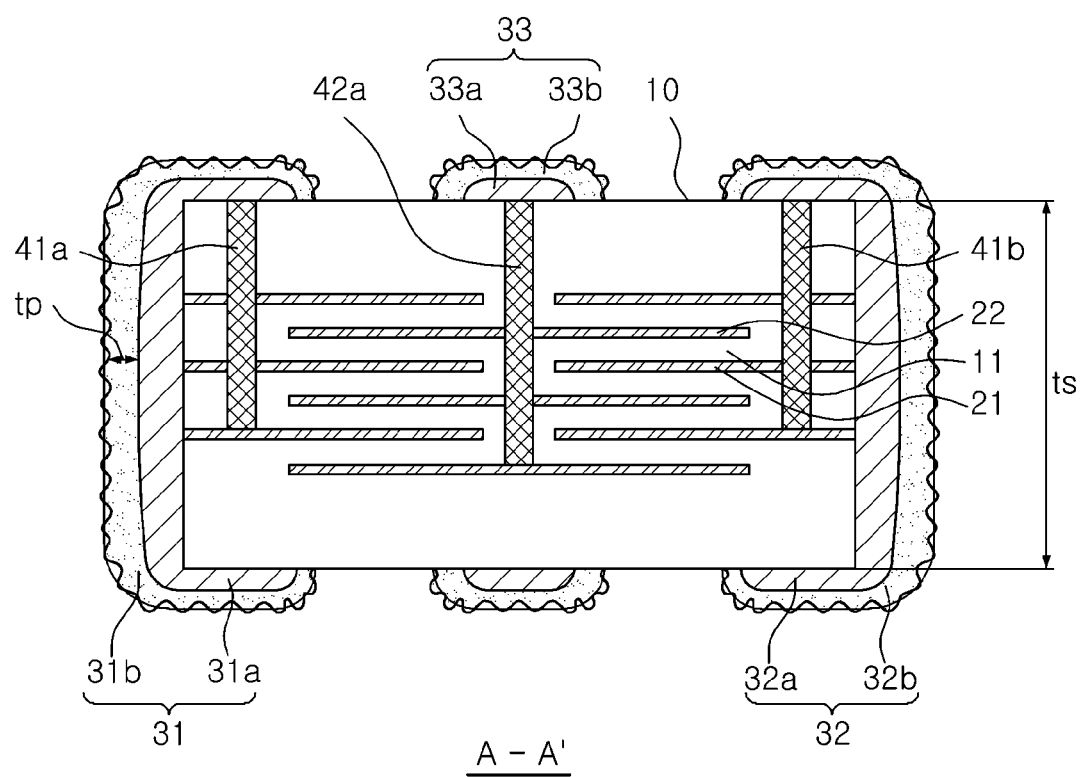

FIGS. 4 and 5 are cross-sectional views, taken along line A-A' of FIG. 1, of the multilayer ceramic electronic part to be embedded in a board according to various exemplary embodiments of the present disclosure.

As described above, the outermost first internal electrodes among the first internal electrodes 21 are connected to the first and second base electrodes 31a and 32a through one or more first vias 41a and 41b extending from at least one of the first and second main surfaces of the ceramic body 10, and the second internal electrodes 22 are connected to the third base electrodes 33a through one or more second vias 42a extending from at least one of the first and second main surfaces of the ceramic body 10, such that the equivalent series inductance (ESL) may be reduced and the first and second vias may be implemented in various forms.

Referring to FIG. 4, the first via may include two or more vias 41a and 41b connected to the first base electrode 31a and two or more vias 41c and 41d connected to the second base electrode 32a. In this case, the distances between the first vias 41a, 41b, 41c and 41d and the second via 42a formed in the ceramic body 10 may become shorter, such that the equivalent series inductance (ESL) may be further reduced.

Referring to FIG. 5, the first vias 41a and 41b may penetrate through the first internal electrodes 21 and extend to be connected to all of the first internal electrodes 21.

Figure 6:
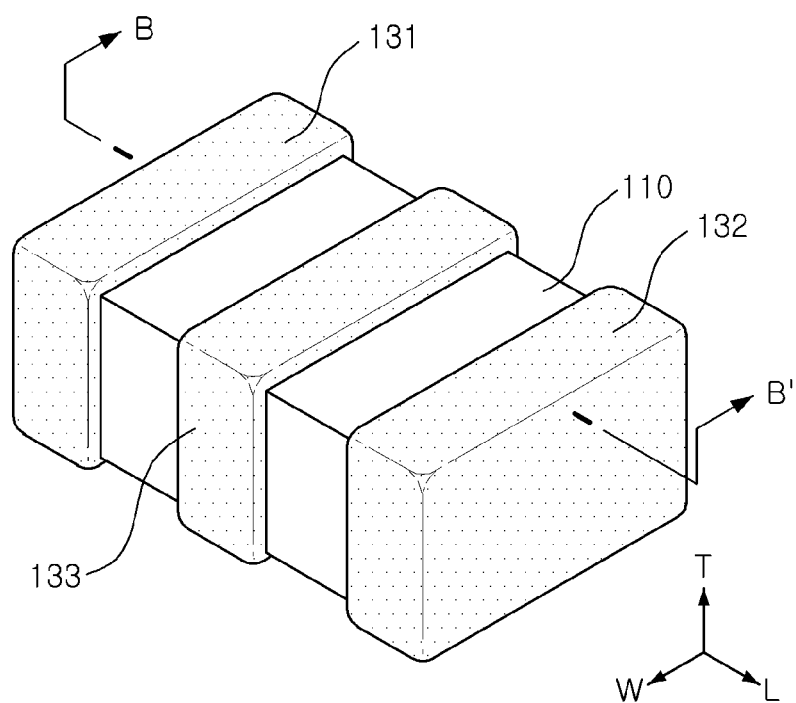
FIG. 6 is a perspective view of a multilayer ceramic electronic part to be embedded in a board according to another exemplary embodiment of the present disclosure.

FIG. 6 is a perspective view of a multilayer ceramic electronic part to be embedded in a board according to another exemplary embodiment of the present disclosure.

Figure 7:
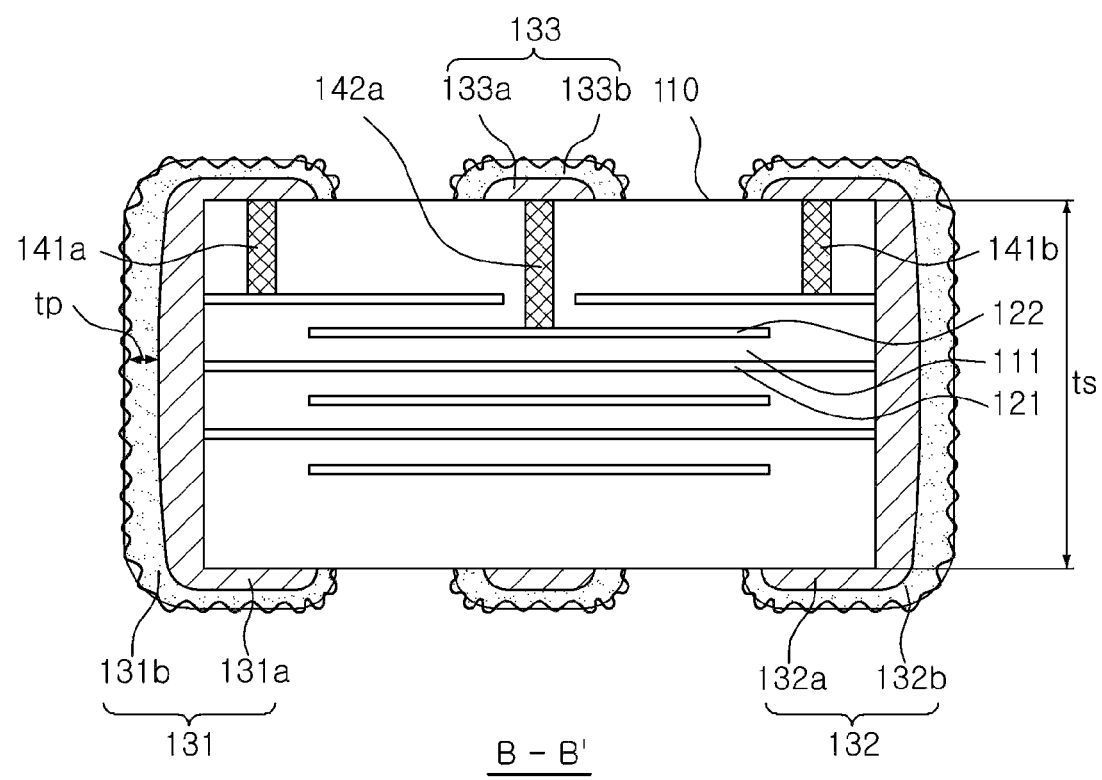
FIG. 7 is a cross-sectional view, taken along line B-B' of FIG. 6, of the multilayer ceramic electronic part according to the exemplary embodiment of the present disclosure.

FIG. 7 is a cross-sectional view, taken along line B-B' of FIG. 6, of the multilayer ceramic electronic part according to the exemplary embodiment.

Figure 8:
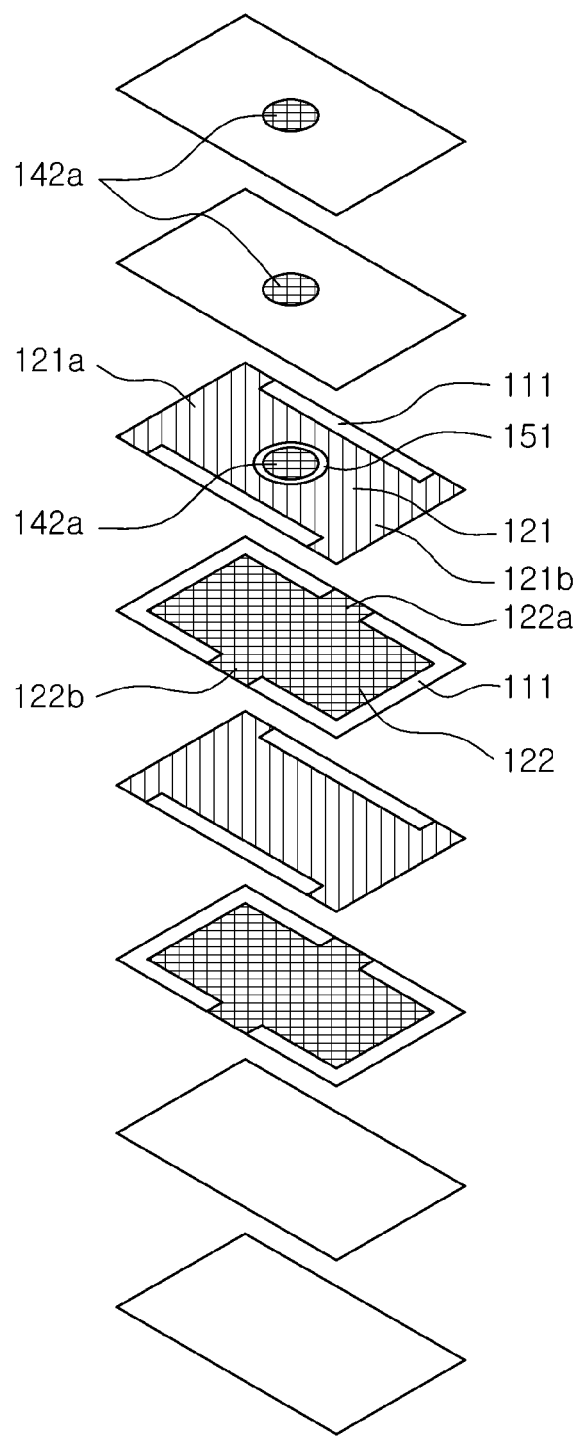
FIG. 8 is an exploded perspective view of the multilayer ceramic electronic part of FIG. 6.

FIG. 8 is an exploded perspective view of the multilayer ceramic electronic part of FIG. 6.

Referring to FIGS. 6 through 8, a multilayer ceramic electronic part to be embedded in a board may include: a ceramic body 110 including dielectric layers 111 and having first and second main surfaces opposing each other, first and second side surfaces opposing each other, and first and second end surfaces opposing each other; first and second internal electrodes 121 and 122 formed in the ceramic body, wherein each of the first internal electrodes 121 has a first lead portion 121a exposed to the first and second side surfaces and the first end surface of the ceramic body 110 and a second lead portion 121b exposed to the first and second side surfaces and the second end surface of the ceramic body 110, and each of the second internal electrodes 122 is spaced apart from the first and second end surfaces of the ceramic body 110 by a predetermined distance and has third and fourth lead portions 122a and 122b exposed to the first and second side surfaces, respectively; first and second external electrodes 131 and 132 each formed on the respective end surfaces of the ceramic body 110 and connected to the first internal electrodes; and a third external electrode 133 formed spaced apart from the first and second external electrodes 131 and 132 while enclosing the ceramic body 110 and connected to the second internal electrodes 122, wherein the first to third external electrodes 131, 132 and 133 include first to third base electrodes 131a, 132a and 133a and first to third terminal electrodes 131b, 132b and 133b formed on the first to third base electrodes 131a, 132a and 133a, respectively, an outermost first internal electrode among the first internal electrodes 121 is connected to the first and second base electrodes 131a and 132a through at least one first via 141a and 141b extended to at least one of the first and second main surfaces of the ceramic body 110, and an outermost second internal electrode among the second internal electrodes 132 is connected to the third base electrode 133a through at least one second via 142a extended to at least one of the first and second main surfaces of the ceramic body 110.

According to the exemplary embodiment of the present disclosure, the third external electrode 133 may be spaced apart from the first and second external electrodes 131 and 132 and enclose the ceramic body 110.

The second internal electrode 122 is formed spaced apart from the first and second end surfaces with third and fourth lead portions 122a and 122b exposed to the first and second side surfaces of the ceramic body 110, such that it may be connected to the third external electrode 133 through the third and fourth lead portions 122a and 122b.

In addition, the outermost second internal electrode among the second internal electrodes 122 is connected to the third base electrode 133a through at least one second via 142a extending from the first or second main surface of the ceramic body 110, such that the equivalent series inductance (ESL) may be further reduced.

In this case, the second via 142a may be formed on the outermost second internal electrodes among the second internal electrodes 122 by forming a through hole 151 in the outermost first internal electrode among the first internal electrodes 121 to pass therethrough, such that the second via 142a may be exposed to at least one of the first and second main surface.

The through hole 151 may insulate the first internal electrode 121 from the second via 142a.

Although the second via 142a is formed only on the upper cover layer such that it is exposed only to the first main surface in FIG. 8, the present disclosure is not limited thereto.

Other features of the exemplary embodiment that are the same as those described with respect to the above embodiments of the multilayer ceramic electronic part will be omitted.

Hereinafter, a method of manufacturing a multilayer ceramic electronic part to be embedded in a board according to the exemplary embodiment of the present disclosure will be described, but the present disclosure is not limited thereto.

A method of manufacturing a multilayer ceramic electronic part to be embedded in a board according to an embodiment of the present disclosure includes, initially, preparing a plurality of ceramic green sheets by applying slurry containing powder such as barium titanate ($BaTiO_3$) or the like onto a carrier film and drying it, thereby forming a dielectric layer.

The ceramic green sheet may be produced by obtaining the slurry by mixing ceramic powder, binder and solvent and forming the slurry in a sheet shape having a thickness of several μm using a doctor blade method.

Next, a conductive paste for internal electrodes containing 40 to 50 parts by weight of nickel powder having an average grain size of 0.1 μm to 0.2 μm may be prepared.

The conductive paste for internal electrodes may be applied onto the green sheet by a screen printing method to form the internal electrodes, and 200 to 300 layers of the internal electrodes may be stacked to thereby form a ceramic body.

A via hole may be drilled from the upper or lower surface of the ceramic body 10 to the outermost internal electrode and be filled with the same nickel paste as that of the internal electrodes, forming the first via.

Further, by drilling a through hole in the internal electrodes and filling it with the same nickel paste as that of the internal electrodes, the second via may be formed.

Then, the first to third base electrodes including a first conductive metal and glass may be formed on the end portions and the upper and lower surfaces of the ceramic body, respectively, such that they are connected to the first via and the second via.

The first conductive metal is not particularly limited, but may be at least one selected from a group consisting of copper (Cu), nickel (Ni), silver (Ag), and an alloy thereof.

The glass is not particularly limited, but may have a same composition as the glass used in manufacturing external electrodes of a typical multilayer ceramic capacitor.

The first and second base electrodes may be formed on the end portions of the ceramic body, and the third base electrode may be formed on the upper and lower surfaces of the ceramic body, such that the first to third base electrodes may be electrically connected to the first and second internal electrodes, respectively.

Then, a plating layer formed of a second conductive metal may be formed on the first to third base electrodes.

The second conductive metal may be, but is not limited to, copper (Cu).

The plating layer may be formed as first to third terminal electrodes.

Other features of the exemplary embodiment that are the same as those described with respect to the above embodiments of the multilayer ceramic electronic part will be omitted.

Hereafter, the present disclosure will be described in detail with reference to Inventive Example, but it is not limited thereto.

In order to evaluate via processing failures according to the thickness of the first and second terminal electrodes 31b and 32b of the multilayer ceramic electronic part to be embedded in a board and bonding surface delamination occurrences according to the surface roughness of the first and second terminal electrodes 31b and 32b according to the exemplary embodiment of the present disclosure, experiments have been carried out after a board having a multilayer ceramic electronic part embedded therein was left at a temperature of 85° C. and a relative humidity 85% for 30 minutes, which are conventional conditions of a chip component for a mobile phone mother board.

Table 1 below shows the evaluation results of failures in via processing according to the thickness of the first to third terminal electrodes.

TABLE 1

| Thickness (μm) of First to Third Terminal Electrodes | Evaluation |
|---|---|
| Less than 1 | X |
| 1~2 | X |
| 2~3 | X |
| 3~4 | Δ |
| 4~5 | ○ |
| 5~6 | ⊚ |
| Greater than 6 | ⊚ |

X: Failure Rate of 50% or higher
Δ: Failure Rate of 10% to 50%
○: Failure Rate of 0.01% to 10%
⊚: Failure Rate lower than 0.01%

As can be seen from Table 1, if the first to third terminal electrodes have a thickness of 5 μm or greater, a multilayer ceramic capacitor having excellent via processing in the board and excellent reliability may be achieved.

On the other hand, it can be seen that if the first to third terminal electrodes have a thickness of less than 5 μm, failures may occur during via processing in the board.

Table 2 below shows the evaluation results of delamination of the bonding surface according to the surface roughness of the first to third terminal electrodes.

TABLE 2

| Surface Roughness (nm) of First to Third Terminal Electrodes | Evaluation |
|---|---|
| Less than 50 | X |
| 50~100 | X |
| 100~150 | Δ |
| 150~200 | ○ |
| 200~250 | ⊚ |
| Greater than 250 | ⊚ |

X: Failure Rate of 50% or higher
Δ: Failure Rate of 10% to 50%
○: Failure Rate of 0.01% to 10%
⊚: Failure Rate lower than 0.01%

As can be seen from Table 2, if the first to third terminal electrodes have a surface roughness of 200 nm or greater, delamination is less likely to occur, such that a reliable multilayer ceramic capacitor may be implemented.

On the other hand, it can be seen that if the first to third terminal electrodes have a surface roughness less than 200 nm, delamination is more likely to occur such that reliability becomes a problem.

Figure 9:
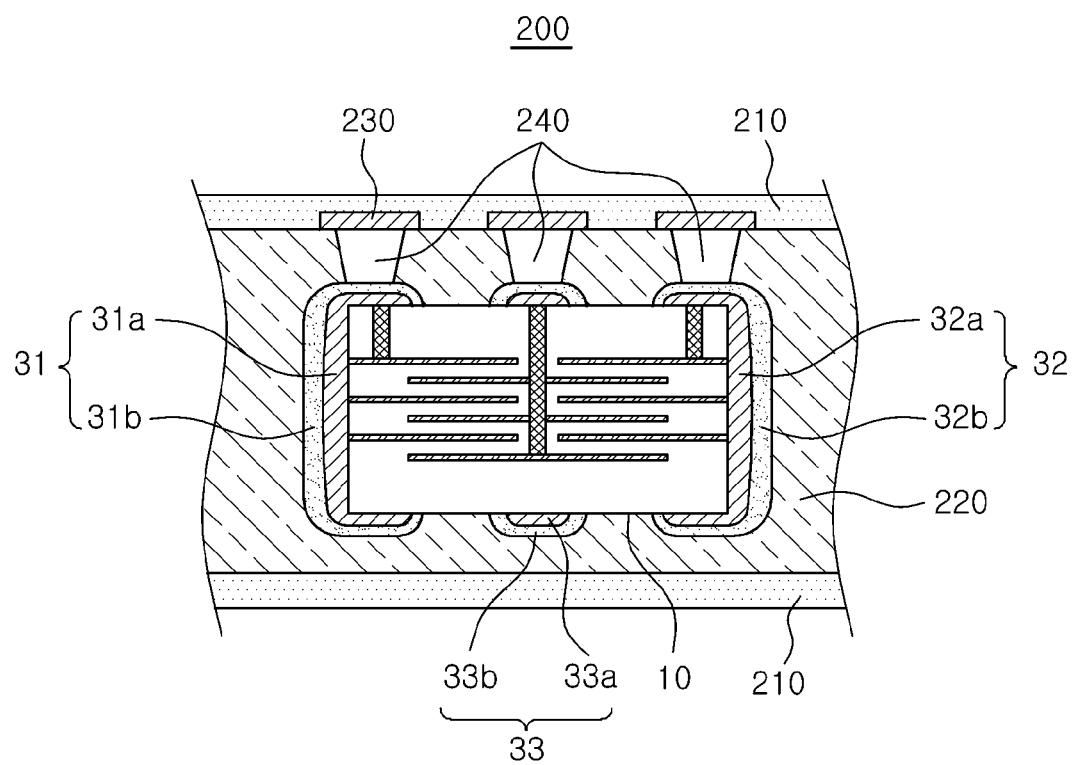
FIG. 9 is a cross-sectional view of a printed circuit board having a multilayer ceramic electronic part embedded therein according to the exemplary embodiment of the present disclosure.

Printed Circuit Board Having Multilayer Ceramic Electronic Part Embedded Therein FIG. 9 is a cross-sectional view of a printed circuit board having a multilayer ceramic electronic part embedded therein according to the exemplary embodiment of the present disclosure.

Referring to FIG. 9, the printed circuit board 200 having a multilayer ceramic electronic part embedded therein may include an insulating substrate 210 and the multilayer ceramic electronic part according to the exemplary embodiment embedded in the insulating substrate 210.

The insulating substrate 210 may include an insulating layer 220 therein and may include conductive patterns 230 and conductive via holes 240 to configure various types of interlayer-circuits as necessary, as shown in FIG. 9. The insulating substrate 210 may be the printed circuit board 200 having a multilayer ceramic electronic part therein.

The multilayer ceramic electronic part may be inserted into the printed circuit board 200 and subjected to various severe conditions during later processes, such as heat treatment of the printed circuit board 200.

In particular, the expansion and contraction of the printed circuit board 200 in the heat treatment process may be directly transmitted to the multilayer ceramic electronic part inserted into the printed circuit board 200, thereby applying stress on the bonding surface between the multilayer ceramic electronic part and the printed circuit substrate 200.

If the stress applied to the bonding surface between the multilayer ceramic electronic part and the printed circuit substrate 200 is greater than the bonding strength thereof, delamination of the bonding surface may occur.

The bonding strength between the multilayer ceramic electronic part and the printed circuit board 200 is proportional to the electrochemical binding force between the multilayer ceramic electronic part and the printed circuit board 200 and to the effective surface area of the bonding surface. Accordingly, in order to improve the effective surface area of the bonding surface between the multilayer ceramic electronic part and the printed circuit board 200, the surface roughness of the multilayer ceramic electronic part may be rendered even to suppress delamination between the multilayer ceramic electronic part and the printed circuit board 200.

In addition, frequency of delamination of the bonding surface with the printed circuit board 200 according to the surface roughness of the multilayer ceramic electronic part to be embedded may be checked.

Moreover, by forming vias in the embedded multilayer ceramic electronic part so as to connect the internal electrodes and the external electrodes through the vias, the current path may be shortened and the equivalent series inductance (ESL) may be reduced.

As set forth above, according to exemplary embodiments of the present disclosure, by forming vias in a multilayer ceramic electronic part to be embedded in a board so as to connect internal electrodes and external electrode through the vias, current paths may be shortened and equivalent series inductance (ESL) may be reduced.

Further, according to exemplary embodiments of the present disclosure, in addition to achieving low inductance, delamination between the multilayer ceramic electronic part and the board may be suppressed by adjusting surface roughness of a plating layer to improve adhesive properties.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic part, the multilayer ceramic electronic part comprising:
   a ceramic body including dielectric layers and having first and second main surfaces opposing each other, first and second side surfaces opposing each other, and first and second end surfaces opposing each other;

pluralities of first and second internal electrodes disposed in the ceramic body, each of the first internal electrodes having a first lead portion exposed to the first and second side surfaces and the first end surface of the ceramic body and a second lead portion exposed to the first and second side surfaces and the second end surface of the ceramic body, and each of the second internal electrodes being spaced apart from the first and second side surfaces and the first and second end surfaces of the ceramic body by a predetermined distance, wherein the first and second internal electrodes are disposed substantially parallel to the first and second main surfaces; and first and second external electrodes formed on the respective end portions of the ceramic body and connected to the first internal electrodes, and a third external electrode formed on the first and second main surfaces of the ceramic body and connected to the second internal electrodes, wherein the first to third external electrodes include first to third base electrodes and first to third terminal electrodes formed on the first to third base electrodes, respectively, one first internal electrode among the plurality of first internal electrodes is connected to the first and second base electrodes through at least one first via extended to the first main surface of the ceramic body, the second internal electrodes are connected to the third base electrode through at least one second via extended to the first main surface of the ceramic body, and each of the first and second vias extends to only one main surface of the ceramic body, the at least one first via extends to and is terminated on an outermost first internal electrode among the first internal electrodes, and the at least one second via extends to the second internal electrodes.

2. The multilayer ceramic electronic part of claim 1, wherein the first internal electrodes have a through hole formed therein so as to be insulated from the second via.

3. The multilayer ceramic electronic part of claim 1, wherein the first and second vias are extended to the first main surface.

4. The multilayer ceramic electronic part of claim 1, wherein the at least one first via includes two or more vias connected to the first base electrode, and two or more vias connected to the second base electrode.

5. The multilayer ceramic electronic part of claim 1, wherein the at least one second via passes through the first internal electrodes so as to be connected to all of the second internal electrodes.

6. The multilayer ceramic electronic part of claim 1, wherein the first and second terminal electrodes are formed of copper (Cu).

7. The multilayer ceramic electronic part of claim 1, wherein the first and second terminal electrodes have a thickness of 5 µm or greater.

8. The multilayer ceramic electronic part of claim 1, wherein when a surface roughness of the first and second terminal electrodes is Ra and a thickness of the first and second terminal electrodes is tp, 200 nm≤Ra≤tp is satisfied.

9. The multilayer ceramic electronic part of claim 1, wherein the first and second terminal electrodes are formed by a plating process.

10. The multilayer ceramic electronic part of claim 1, wherein the ceramic body has a thickness of 250 µm or less.

11. A printed circuit board having a multilayer ceramic electronic part embedded therein, the printed circuit board comprising:
  an insulating substrate; and
  the multilayer ceramic electronic part of claim 1, embedded in the insulating substrate.

* * * * *